United States Patent [19]

Kranik et al.

[11] 3,993,018
[45] Nov. 23, 1976

[54] CENTRIFUGAL SUPPORT FOR WORKPIECES

[75] Inventors: John R. Kranik, Poughkeepsie; Wolfgang F. Mueller, Wappingers Falls, both of N.Y.

[73] Assignee: International Business Machines Corporation, Armonk, N.Y.

[22] Filed: Nov. 12, 1975

[21] Appl. No.: 631,013

[52] U.S. Cl. .................................. 118/52; 118/503; 233/26; 279/1 C; 279/1 V
[51] Int. Cl.² ....................................... B05C 11/02
[58] Field of Search .......................... 118/52–56, 118/500, 503, 319; 279/1 C, 1 V; 269/1 NQ; 233/26; 427/240, 241

[56] References Cited
UNITED STATES PATENTS

| | | | |
|---|---|---|---|
| 1,010,162 | 11/1911 | Martin | 279/1 C X |
| 2,593,706 | 4/1952 | Zelewsky | 279/1 C X |
| 2,916,290 | 12/1959 | Skillin | 279/1 V |
| 2,982,558 | 5/1961 | Multer | 279/1 C X |
| 3,157,408 | 11/1964 | Mann | 279/1 V |
| 3,352,280 | 11/1967 | Hughes et al. | 118/319 X |
| 3,675,563 | 7/1972 | Metreaud | 118/319 X |
| 3,786,986 | 1/1974 | Guerrero | 233/26 |
| 3,834,613 | 9/1974 | Hankey | 233/26 X |
| 3,938,815 | 2/1976 | F'Geppert | 279/1 C |

*Primary Examiner*—Morris Kaplan
*Attorney, Agent, or Firm*—Henry Powers

[57] ABSTRACT

A chuck for a workpiece, rotatable in spaced relation to and about an axis of rotation, and having a clamp jaw radially movable under centrifugal force to engage the workpiece against fixed mating clamp members. The structure can also have optional means enabling the chuck to tilt, with the workpiece, from a home position to a preselected angle under the rotation thereof about a pivot axis perpendicular to and spaced from the axis of rotation with return of the chuck to the home position under gravitational force when rotation thereof is stopped.

14 Claims, 9 Drawing Figures

CENTRIFUGAL SUPPORT FOR WORKPIECES

FIELD OF THE INVENTION

This invention relates to chucks or clamping devices for holding workpieces, and more particularly, to an apparatus for holding semiconductor wafers under centrifugal action during device fabrication.

BACKGROUND OF THE INVENTION

Although the apparatus of this invention may be employed for holding articles of various kinds and of various shapes, it has been designed for particular application for holding disc shaped semiconductor wafer for processing thereof with a radiation beam such as described in U.S. Pat. No. 3,778,626.

As described in the aforesaid patent, with respect to ion implantation, a workpiece, such as a semiconductor wafer is attached to a scanner disc and moved with respect to a beam of radiation. The movement comprises rotation of the target plate and traversal thereof relative to a fixed beam path so that radiation beam impinges on the workpiece in a predetermined path in a manner enabling regulation of the desired dosage and configuration of exposure.

SUMMARY OF THE INVENTION

The invention comprehends apparatus for securing workpieces in orientations required for various processing operations, and which is particularly adapted for use in ion implantation of semiconductor wafers in accordance with the system disclosed in the aforesaid U.S. Pat. No. 3,778,626. In accordance with this invention, the apparatus comprises a chuck facilitating loading and unloading of workpieces, such as semiconductor wafers, on a rotating support with automatic positive clamping action during rotation of the support.

In accordance with another aspect of the invention, the chucks are adapted to orient the workpiece at an angle with respect to the plane of the support where required for processing. Typically, such tilt orientation of a semiconductor wafer adapts it for "off axis ion implantation" to minimize, if not eliminate, channeling without need of additonal processing steps such as implantation through an amorphous layer requiring pre-bombardment, by an inert ion beam or ions, of the substrate material.

DESCRIPTION OF THE PREFERRED EMBODIMENTS

Figure 1:
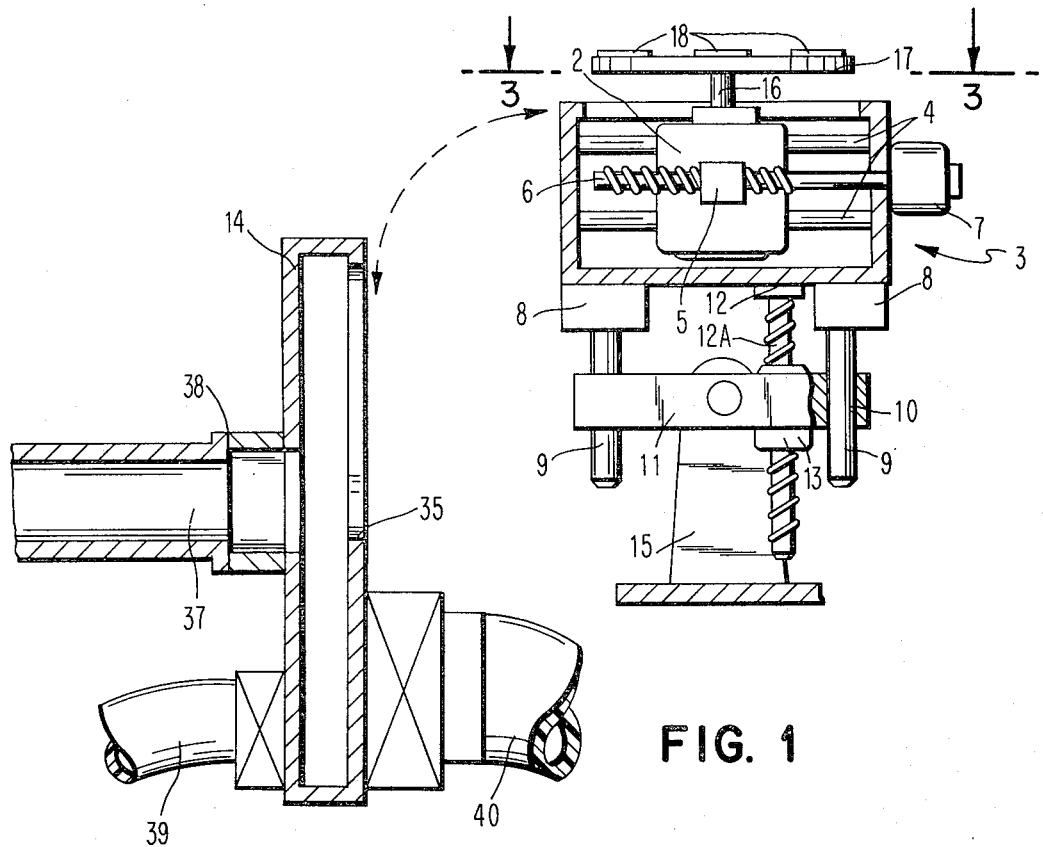
FIGS. 1 and 2 are elevational drawings for illustrating one embodiment of this invention.
Figure 2:
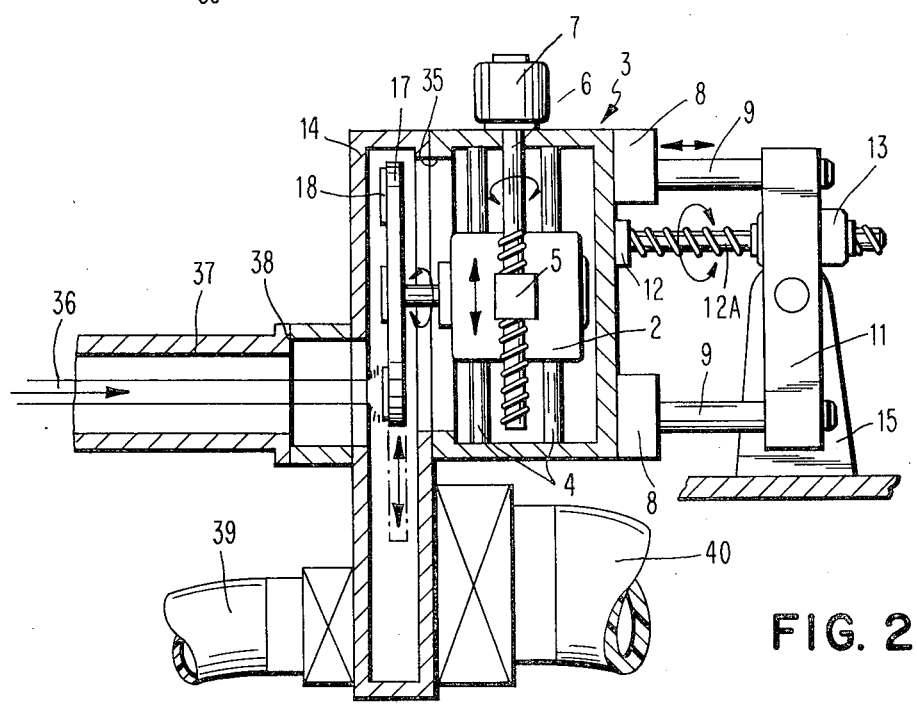

FIGS. 1 and 2 show an apparatus 1 for treating workpieces, e.g. semiconductor wafers with a radiation beam, such as in the manner described in the aforesaid U.S. Pat. No. 3,778,626.

The structure will comprise a motor 2 mounted within a housing 3 adapted for reciprocal linear movement therein along guide posts 4 extending through suitable slide bores (not shown) provided on motor 2. Reciprocation of motor assembly 2 is obtained by means of a traveling nut 5, secured thereto, threadedly engaged about a lead screw 6 rotated by a reversible motor 7 suitably mounted in sealed relation to the exterior of housing 3.

The housing 3 also includes mounting blocks 8 to which are secured the projecting guide rods 9 mounted through slide bores 10 of a bracket 11. Housing 3 also includes a journal block 12 in which is mounted a reversing lead screw 12a rotated by a drive motor 13 which is supported on bracket 11, whereby housing 3 can be moved into and out of sealing engagement with a processing chamber 14.

Alternatively, the same function can be obtained by means of a two-way extensibly retractible air cylinder.

Bracket 11 is pivotally mounted on the upright frame member 15 about which the housing 3 can be pivoted 90° by appropriate means, not shown, from an upright load/unload position, as shown in FIG. 1, to a rotated work position, as shown in FIG. 2, for sealing engagement with processing chamber 14.

Mounted to the shaft 16 of motor 2 is a rotatable scanning disc or support plate 17 containing a plurality of chuck or clamping assemblies for securing semiconductor wafers 18 thereon. The chuck units are located in balanced distribution within corresponding recesses 19 in scanning disc 17.

In general, the chuck units will be dispersed in radially spaced relation to the axis of motor shaft 16 within a plane perpendicular thereto.

Figure 3:
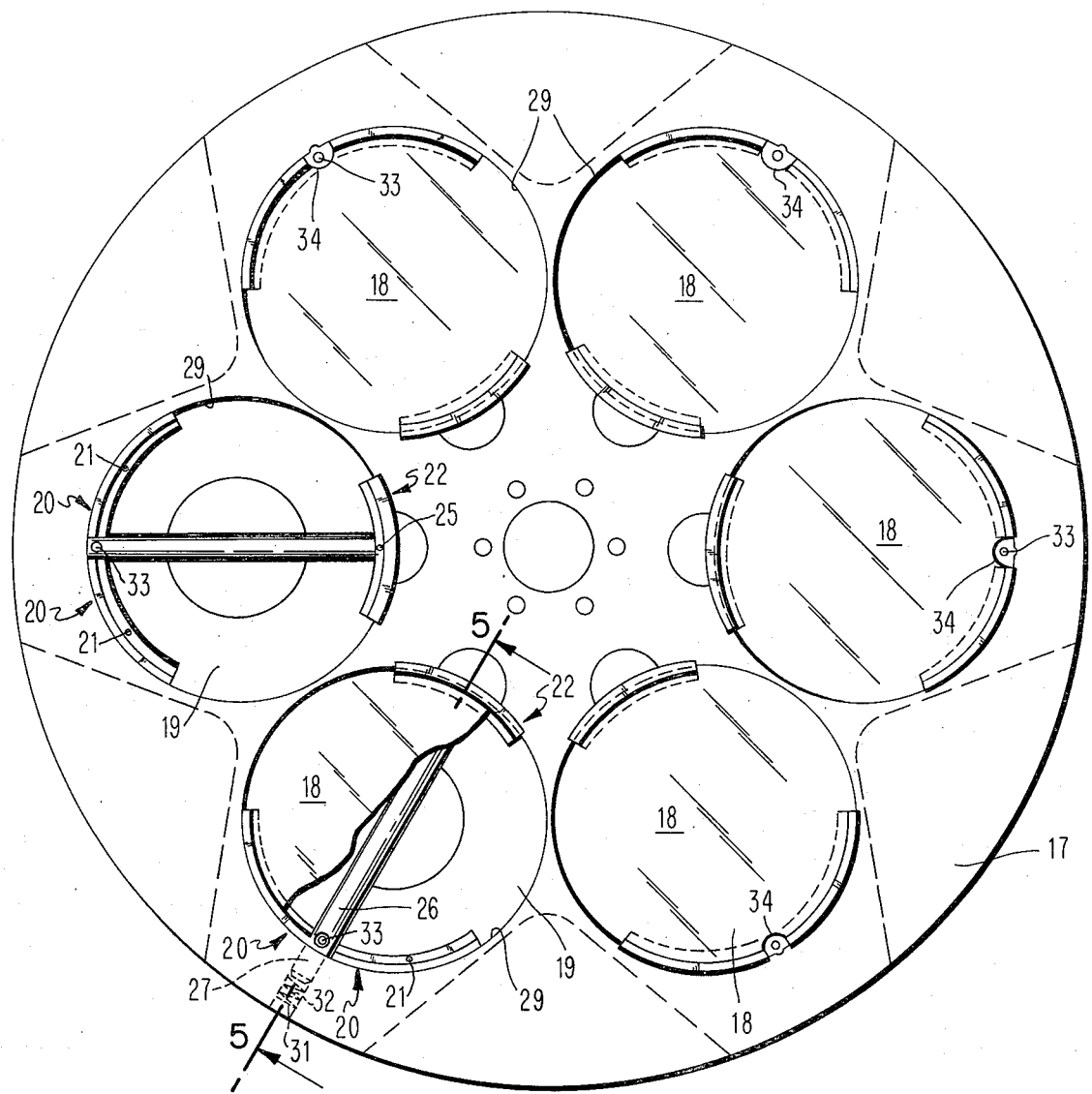
FIG. 3 is a plan view taken along lines 3—3 of FIG. 1.
Figure 4:
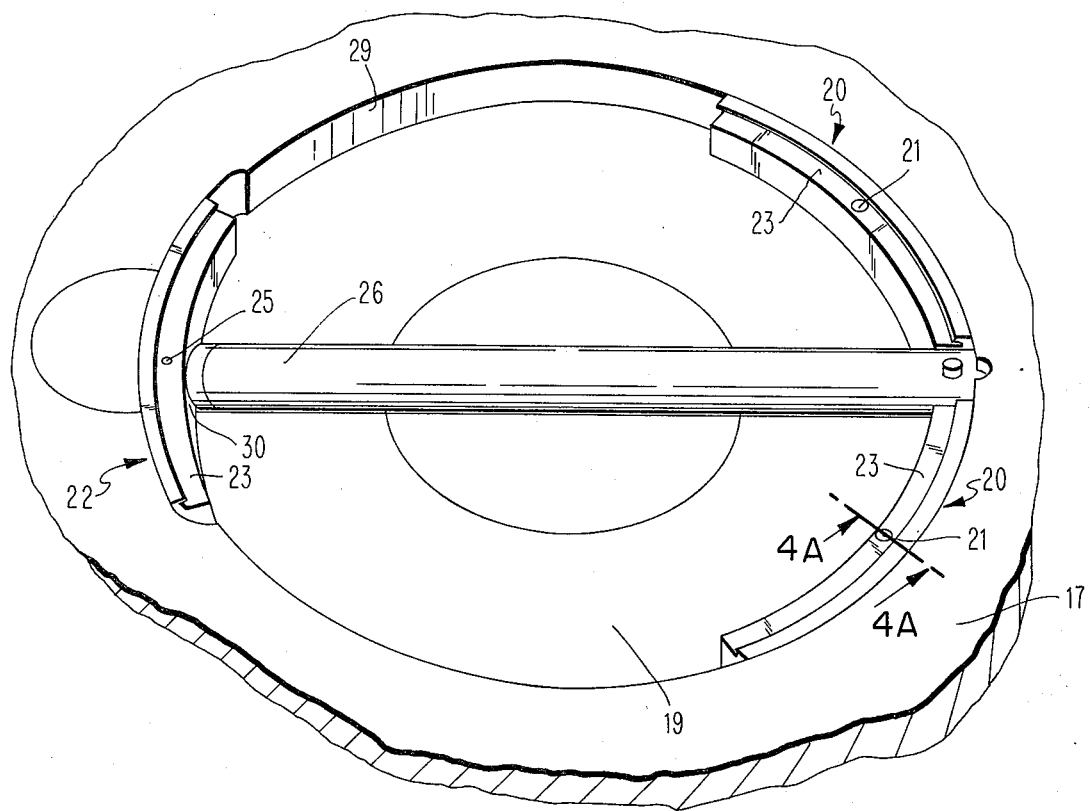
FIG. 4 is a detailed view in perspective of one wafer chuck in accordance with this embodiment.
Figure 4A:
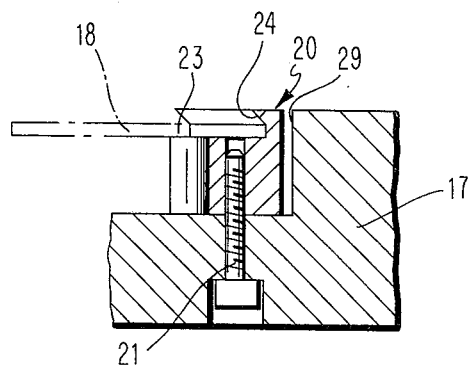
FIG. 4A is a cross-sectional view taken along line 4A—4A of FIG. 4.

The chuck units (FIGS. 3 and 4) comprise two fixed (laterally spaced) wafer clamps 20 single point mounted within recess 19 at 21 to scanning disc 17, which provides a pivoting adjustment to the peripheral contours of semiconductor wafers 18. The chuck units also comprise a third floating wafer clamp 22 which is radially actuable, relative to the axis of motor shaft 16, for coaction with fixed clamps 20 to secure the wafer 18 therebetween. In operation, wafer 18 is placed on bearing surfaces 23, of clamp members 20 and 22, and secured therebetween in their closed position under the clamp overhang 24 (FIG. 4A).

Figure 5:
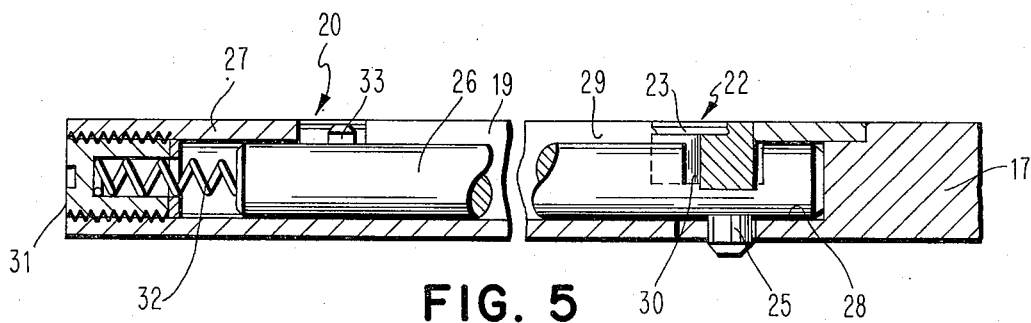
FIG. 5 is a cross-sectional view taken along line 5—5 of FIG. 3.

The floating clamp is also single point mounted at 25 (for wafer contour adjustment) to a weight 26 slidably mounted with radially extending bores 27 and 28 provided in the walls 29 of the scanning disc recesses 19 (FIG. 5). In the embodiment shown in FIG. 3, weight 26 comprises a rod having one end shaped in a hemispherical configuration 30 engaged in sliding relationship with the mating bore 28, with the other end of the rod in like engagement within mating bore 27, extending to the periphery of scanning disc 17, and within which is provided a retaining screw 31. Mounted in bore 27 between screw 31 and the end of the weight (e.g. rod) 26 is a compression spring 32 which biases the floating clamp 22, toward the axis of motor shaft 16, in the open position. Retainer screw 31 is also employed to adjust the preload clamping force of bias spring 32.

Also provided on weight (e.g. rod) 26 is an orient-/eject pin 33, for engagement in notch 34 of wafer 18 during loading, and disengagement of wafer 18 from the overhang of clamps 20 for unload.

For loading of wafers 18, the housing assembly 3 will be positioned in the upright position, as shown in FIG. 1, with the scanning disc 17 stationary, at an rpm. $\omega =$ 0. In this condition, the clamping element 22 will be biased by spring 32, in the open position for unobstructed loading in the chuck units until all units are filled (e.g. 6 wafers as shown in FIG. 3 with the locator pin 33 registered with wafer notch 34.

After loading is completed, the scanning disc 17 is accelerated by motor 2, to its final speed (as for example $\omega = 500$ to 1000 rpm.) while disc 17 is in the horizontal position.

During rotation, the centrifugal force on weight 26 overcomes the bias of spring 32 to bring the floating clamp member 22 into contact with wafer 18 to secure it against clamp members 20 beneath overhang 24. With the scanner disc 17 rotating with its clamped wafers 18, the housing 3 is pivoted to bring scanning disc 17 in the vertical plane, as shown in FIG. 2, which is registered with an opening 35 in processing chamber 14 and positioned so that the wafers 18 are rotatably scanned past the focal axis of an ion beam 36 (from a suitable source, not shown) in a column 37 secured by a gland 38 to processing chamber 14. In the pivoted position, the housing 3 is moved by lead screw 12a and motor 13 (or by a double acting cylinder, not shown) into sealing relationship (e.g. by O-rings or the like) about opening 35 of processing chamber 14. In position, the assembly is roughed down via conduit 39 by a vacuum pump, not shown, and brought to final pressure via conduit 40 by a high vacuum pump, not shown.

When operating vacuums are reached, the ion beam 36 is directed through analyzing, accelerating and focussing elements, not shown, onto the wafers 18. The wafers 18 may concurrently be radially traversed by motor 7 and lead screw 6, across beam 36, as described in the aforesaid U.S. Pat. No. 3,778,626, to effect the desired ion implantation in wafers 18 in accordance with a prescribed pattern.

After implantation, the assembly is pressurized to ambients, housing 3 retracted from processing chamber and pivoted to the upright position where the scanning disc 17 is in the horizontal load/unload position, and decelerated to rest. As scanning disc 17 decelerates, the centrifugal effects on weight 26 will diminish to a point where the bias of spring 32 is enabled to retract weight 26 and floating clamp 22 with the wafer 18 ejected by pin 33 to a position free of all clamps 20 and 22, where the wafer can be suitably unloaded as by a Bernoulli pick-up, vacuum chucks, and the like.

Figure 6:
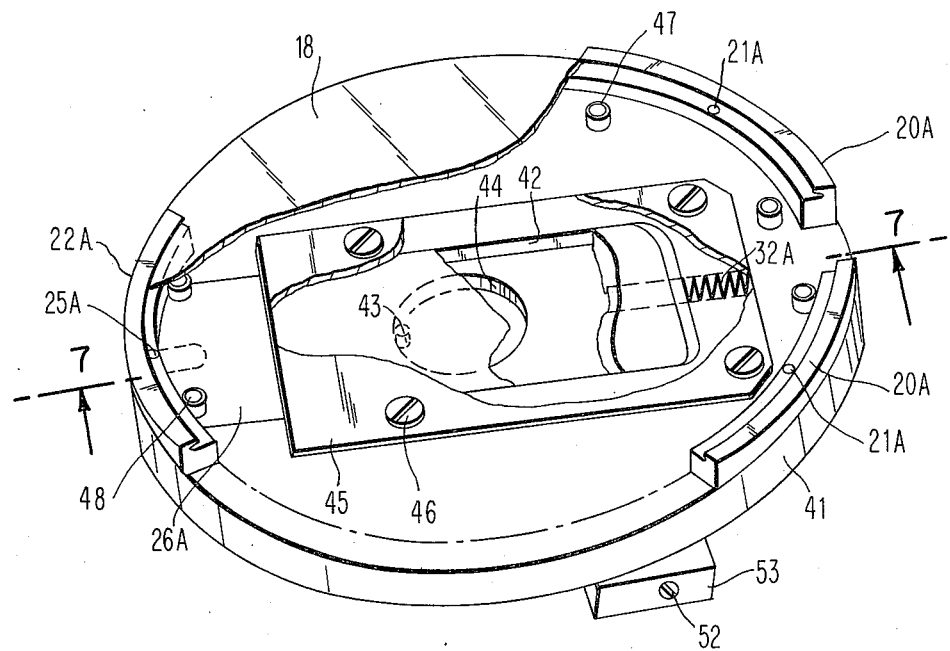
FIG. 6 is a view in perspective illustrating other embodiments of this invention.

FIG. 6 shows another embodiment of the invention where the chuck assembly is integrated in a discrete form for mounting in appropriate recesses of scanning disc 17. In the configuration shown, the chuck assembly comprises a weight 26a in the form of a plate member mounted in a recess 42 of a circular support 41 which is mounted in its recess 19a. This arrangement provides radial movement of weight 26a relative to the axis of motor shaft 16. Radially extending channel 42 in support 41 contains spring 32a to bias weight 26a inwardly toward the axis of motor shaft 16. Weight 26a is retained on support 41 by limiting its extension, by bias spring 32a, via a stop pin 43 depending below weight 26a in a suitable opening 44 in support 41. Weight 26a and bias spring 32a are retained in their recesses by means of a cover plate 45 secured by screws 46 to support 41. Two radially fixed clamping elements 20a are single point mounted by pivot pin 21a to accommodate contour adjustment about a wafer 18. Pivotal movement of clamp elements 20a is limited by suitable stop pins 47. A third floating clamp element 22a is also single point mounted about pivot pin 25a to weight 26a, and its swing limited by stop pins 48. Clamping elements 20a and 22a are configured in the same way as in the preceding embodiment, with a bearing surface 23 and a retainer overhang or lip 24 as shown in FIG. 4A.

This embodiment functions in substantially the same manner as scanning disc 17 is rotated about the axis of shaft 16 by motor 2.

Figure 7:
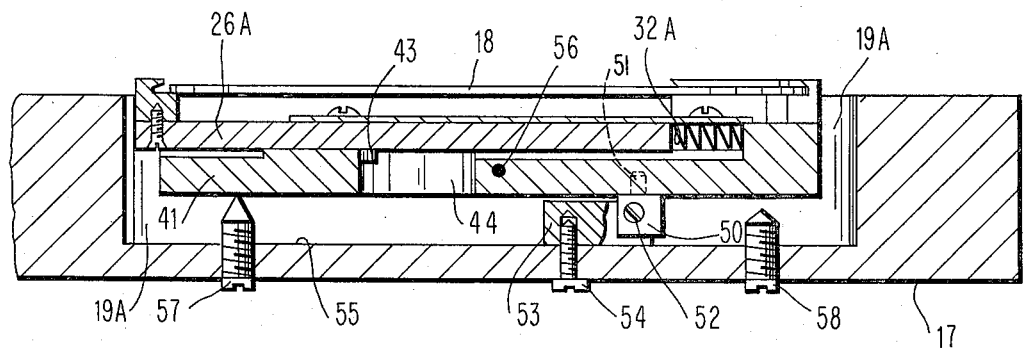
FIG. 7 is a cross-sectional view taken along line 7—7 of FIG. 6.
Figure 8:
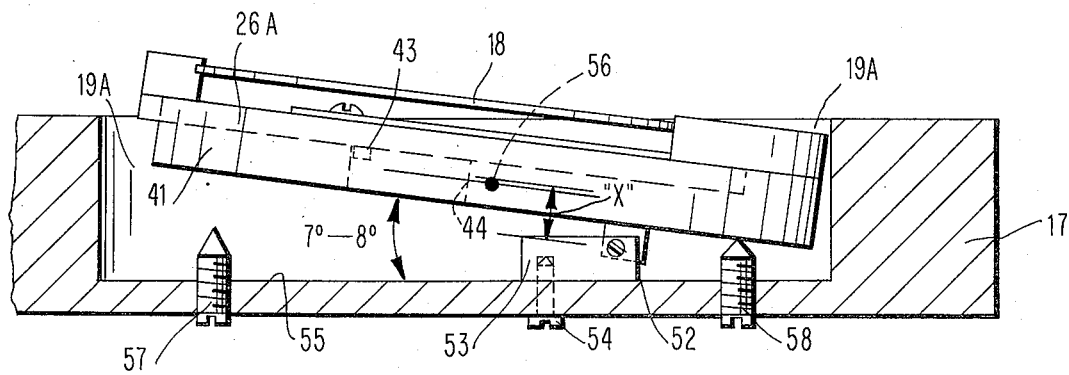
FIG. 8 illustrates the spatial orientation of the embodiment of FIG. 7 under centrifugal force during rotation.

In accordance with another aspect of this invention, the chuck assembly of this second embodiment (FIGS. 7 and 8) is provided with means to control channel effects, during ion implantation. Channeling occurs when the ions introduced into wafers 18 are parallel with each other and with an open crystallographic direction in semiconductor wafers. This aspect of the invention enables control of channeling by intentional alignment of the wafers, relative to the incident ion beam 36, away from the channeling direction, e.g. for silicon semiconductor wafers, a 7° or 8° tilt plus 17° to 18° rotation from the [111] or [100] directions.

The means provided by this invention enables the obtention of such proper orientation in the chuck assembly. This is accomplished by means of a mounting block 50 secured, as by recessed screws 51, to the lower surface of chuck support 41. The chuck assembly is suspended, on scanner disc 17, by mounting block 50 on two pivot points 52 within a yoke 53 which is secured, as by screws 54, to the bottom wall 55 of scanner disc recess 19a.

Pivot points 52 are located below the center of gravity 56 (dimension "X") of the chuck assembly and outwardly of the center of gravity 56 toward the periphery of the scanner disc 41. For load/unload operations, the chuck assembly is maintained parallel to the horizontal plane of scanner disc 17 by means of adjustable level screws 57. Normally, the axis of pivot points 52 will extend on a line space from and perpendicular to the axis of motor shaft 16.

After loading of wafers is completed in the chuck assemblies, the scanning disc 17, while in the horizontal load position is accelerated to its final scanning speed (e.g. $\omega = 500$ to 1000 rpm). On acceleration, centrifugal force will move the clamp element 22a outwardly radially against wafer 18 to secure it against clamp elements 20a. Concurrently, since pivot points 52 are offset, as indicated, from the chuck assembly's center of gravity 56, the centrifugal force of rotation will cause the chuck assembly to tilt to a preset angle, relative to the plane of scanner disc 17, as determined by set screw 58.

On reaching the desired rotational speed, the scanner disc 17 is then pivoted with housing 3 into the vertical plane for cooperative engagement within processing chamber 14 for ion implantation. Since wafers 18 are provided relative to the incidence of ion beam 36, at a preset angle (e.g. 7°) off the perpendicular, channeling effects are suppressed during the implant operation.

While the invention has been particularly shown and described with reference to the preferred embodiments thereof, it will be understood by those skilled in the art that the foregoing and other changes in form and detail may be made therein without departing from the spirit and scope of the invention.

What is claimed is:
1. A rotatable support for a workpiece comprising:
   A. a holder for said workpiece in spaced relation to a first axis of rotation with said holder normally disposed under gravitational force in a first position within a plane substantially perpendicular to said first axis;
   B. means for rotating said support whereby to orbit said holder about said first axis;
   C. means for tilting said holder to a preselected angle about a second axis spaced from and perpendicular to said first axis in response to centrifugal force of said rotation, with said tilting disposing said holder in a plane transverse said axis;
   D. said holder comprising jaw means normally disposed in open workpiece receiving position in radially spaced relation to said first axis of rotation; and means for clamping said jaws means about said workpiece during said rotation in response to centrifugal force thereof.

2. The support of claim 1 wherein said rotatable support includes a plurality of said holders circumferentially spaced with respect to said first axis.

3. The support of claim 1 wherein said jaw means comprises first and second jaw means radially movable into closed and clamping positions relative to each other.

4. A workpiece holding device comprising:
   A. a mounting plate rotatable about a first axis extending normally therethrough;
   B. means for rotating said plate about said axis;
   C. at least one holder means on a face of said plate, for each of a said workpiece, disposed radially of said axis and comprising a jaw means movable into clamping relationship with a said workpiece in response to the centrigugal force developed during rotation of said mounting plate; and
   D. means for tilting said holder on a second axis spaced from said perpendicular to said first axis during rotation of said plate in response to the centrifugal force thereof.

5. The device of claim 4 wherein said holder is pivotally mounted along said second axis within a recess in said plate.

6. The device of claim 5 wherein said second axis is
   A. radially spaced from the center of gravity of said holder toward the periphery of said plate, and
   B. below said center of gravity intermediate thereto and the bottom of said recess.

7. The device of claim 4 including means for limiting the said tilting of said holder.

8. The device of claim 4 including means for pivoting said plate, on a third axis perpendicular to and spaced from said first axis, to dispose said face into horizontal and vertical planes.

9. A workpiece holding device comprising:
   A. a mounting plate rotatable about a first axis extending normally therethrough;
   B. means for rotating said plate about said axis;
   C. at least one holder means on a face of said plate for respective each of a said workpiece disposed radially of said axis, with said holder means including
   D. chuck means for said workpiece adapted for movement into open and clamping positions in a direction radially of said axis, with said chuck means comprising
   E. first jaw means adjacent the periphery of said plate and secured against radial movement, and
   E. second jaw means adapted for radial movement toward and away from said first jaw means;
   G. means biasing said second jaw means radially in the open position toward said axis;
   H. means responsive to the rotation of said plate for centrifugally moving said second jaw means toward said first jaw means in said clamping position therewith about said workpiece; and
   I. said mounting plate being pivotally mounted upon a second axis spaced from and normal to said first axis; and said mounting plate being adapted to tilt upon said record axis in response to centrigugal force developed during rotation of said mounting plate.

10. The device of claim 9 wherein said means responsive to the rotation of said plate - responsive to the rotation of said comprises a weight element disposed below said workpiece and adapted for limited radial movement relative to said axis, with said element operatively engaged with said second jaw means and said biasing means for normally disposing said second jaw means in the open position with movement thereof into the clamping position relative to said first jaw means, about said workpiece, in response to centrifugal force on rotation of said plate.

11. The device of claim 9 wherein said first and second jaw means are pivotally mounted in limited movement on respective second axes perpendicular to said holder means to accommodate clamping about the peripheral configuration of said workpiece.

12. The device of claim 4 wherein said holder means includes
   A. chuck means for said workpiece adapted for movement into open and clamping positions in a direction radially of said first axis, with said chuck means comprising,
   B. first jaw means adjacent the periphery of said plate and secured against radial movement; and
   C. said movable jaw means adapted for radial movement toward and away from said first jaw means;
   D. means biasing said second jaw means radially in the open position towards said first axis.

13. The device of claim 12 wherein said holder is pivotally mounted along said second axis within a recess of said plate; and means effecting movement of said moveable jaw means into clamping relationship comprises a weight element disposed below said workpiece and adapted for limited radial movement relative to said first axis, with said element operatively engaged with said second jaw means and said biasing means for normally disposing said second jaw means in the open position with movement thereof into the clamping position relative to said first jaw means, about said workpiece during rotation of said plate in response to centrifugal force thereof.

14. The device of claim 13 wherein said second axis is
   A. laterally spaced from the center of gravity of said holder toward the periphery of said plate, and
   B. below said center of gravity intermediate thereto and the bottom of said recess.

* * * * *